(12) United States Patent
Xie et al.

(10) Patent No.: US 7,045,890 B2
(45) Date of Patent: May 16, 2006

(54) HEAT SPREADER AND STIFFENER HAVING A STIFFENER EXTENSION

(75) Inventors: Hong Xie, Phoenix, AZ (US); Kristopher Frutschy, Phoenix, AZ (US); Koushik Banerjee, Chandler, AZ (US); Ajit Sathe, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 302 days.

(21) Appl. No.: 09/964,494

(22) Filed: Sep. 28, 2001

(65) Prior Publication Data

US 2003/0062618 A1 Apr. 3, 2003

(51) Int. Cl.
H05K 1/16 (2006.01)
H05K 7/20 (2006.01)
H01L 23/34 (2006.01)
H01L 23/367 (2006.01)
H01L 23/12 (2006.01)

(52) U.S. Cl. .............. 257/706; 257/712; 257/713; 257/717; 257/720; 257/701; 257/707; 257/710; 257/704; 257/668; 257/700; 257/696; 257/698; 361/720; 361/704; 361/707; 361/700; 361/785; 174/260; 174/261

(58) Field of Classification Search ............. 257/706, 257/712, 713, 717, 720, 704, 710, 707, 668, 257/696, 700, 701, 758, 698, 738, 697, 737, 257/778, 734; 361/720, 704, 707, 700, 785; 174/260, 261
See application file for complete search history.

(56) References Cited

U.S. PATENT DOCUMENTS

| 4,636,580 | A | * | 1/1987 | Neidig et al. ........... 174/52.2 |
| 5,014,159 | A | * | 5/1991 | Butt ....................... 361/717 |
| 5,523,622 | A |   | 6/1996 | Harada et al. .......... 257/734 |
| 5,724,230 | A |   | 3/1998 | Poetzinger ............. 361/758 |
| 5,767,447 | A | * | 6/1998 | Dudderar et al. ....... 174/52.4 |
| 5,801,440 | A |   | 9/1998 | Chu et al. .............. 257/691 |
| 5,898,571 | A |   | 4/1999 | Mertol ................... 361/704 |
| 5,925,925 | A |   | 7/1999 | Dehaine et al. ........ 257/659 |
| 5,990,418 | A | * | 11/1999 | Bivona et al. .......... 174/52.4 |
| 6,015,722 | A |   | 1/2000 | Banks et al. ........... 438/108 |
| 6,037,193 | A | * | 3/2000 | Interrante et al. ...... 438/122 |
| 6,191,360 | B1 | * | 2/2001 | Tao et al. ............... 174/52.4 |
| 6,191,478 | B1 | * | 2/2001 | Chen .................... 257/718 |
| 6,201,301 | B1 | * | 3/2001 | Hoang .................. 257/712 |
| 6,242,279 | B1 | * | 6/2001 | Ho et al. ............... 438/106 |
| 6,246,115 | B1 | * | 6/2001 | Tang et al. ............ 257/706 |
| 6,271,058 | B1 |   | 8/2001 | Yoshida ................ 438/108 |
| 6,285,550 | B1 |   | 9/2001 | Belady ................. 361/704 |
| 6,309,908 | B1 | * | 10/2001 | Sarihan et al. ......... 438/106 |
| 6,338,985 | B1 | * | 1/2002 | Greenwood ........... 438/126 |
| 6,376,769 | B1 | * | 4/2002 | Chung .................. 174/52.2 |
| 6,432,742 | B1 | * | 8/2002 | Guan et al. ............ 438/106 |
| 6,452,113 | B1 | * | 9/2002 | Dibene et al. ......... 174/260 |
| 6,452,804 | B1 | * | 9/2002 | Dibene et al. ......... 361/720 |
| 6,599,779 | B1 | * | 7/2003 | Shim et al. ............ 438/122 |
| 2002/0140108 | A1 | * | 10/2002 | Johnson ............... 257/778 |
| 2002/0185724 | A1 | * | 12/2002 | Forthun et al. ........ 257/686 |
| 2002/0195270 | A1 | * | 12/2002 | Okubora et al. ....... 174/260 |
| 2003/0000736 | A1 | * | 1/2003 | Sathe ................... 174/255 |

FOREIGN PATENT DOCUMENTS

| DE | 4332115 | 3/1995 |
| DE | 19623826 | 12/1997 |
| EP | 0865082 | 9/1998 |

OTHER PUBLICATIONS

"Method of Heat Sinking an Array of Discrete Electronic Packages", 2244 Research Disclosure (1992) Oct. 1992, No. 342, Emsworth, GB.

* cited by examiner

*Primary Examiner*—Alexander Oscar Williams
(74) *Attorney, Agent, or Firm*—Schwegman, Lundberg, Woessner & Kluth, P.A.

(57) ABSTRACT

A heat spreader and stiffener device has a stiffener portion extending towards a center of the heat spreader and stiffener device and mountable to a die-side surface of a substrate.

67 Claims, 7 Drawing Sheets

HEAT SPREADER AND STIFFENER HAVING A STIFFENER EXTENSION

BACKGROUND

The complexity of semiconductor devices continues to increase. System performance is bounded by the weakest element. As integrated functions increase, mounting and package design, having major impact on device performance and functionality, must evolve. Mounting and package technology must meet system demands as designers simultaneously seek to shrink their products, set higher expectations for performance, and reduce cost. Portable systems have progressively compact, high-performance packaging. Present core-less or thin core substrates have difficulty in withstanding post-assembly mechanical loads (e.g. socketing, shock loading, handling) without deflection, deformation, and possibly damage.

BRIEF DESCRIPTION OF THE DRAWINGS

The following represents brief descriptions of the drawings, wherein.

DETAILED DESCRIPTION

Figure 1:
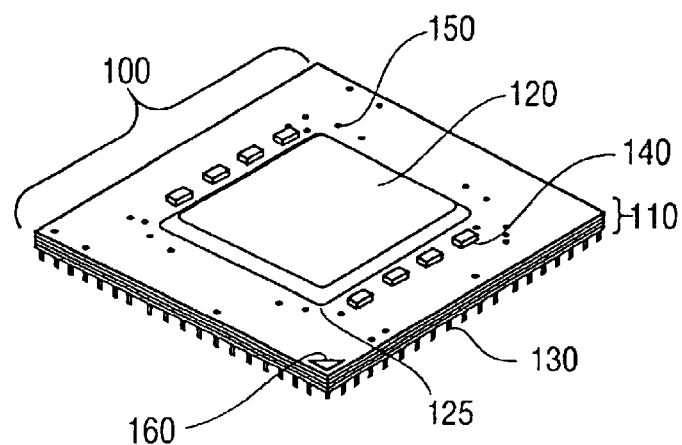
FIG. 1 relates to a perspective view of an example flip chip pin grid array (FC-PGA) system useful in explanation and understanding of background, and example, embodiments of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Well-known power/ground connections to substrates, ICs and other components may not be shown in great detail within the FIGS. for simplicity of illustration and discussion, and so as not to obscure the invention. Further, arrangements may be shown in simplistic diagram form in order to avoid obscuring the invention, and also in view of the fact that specifics with respect to implementation of such diagram arrangements are highly dependent upon the platform within which the present invention is to be implemented, i.e. specifics should be well within the purview of one skilled in the art. Where specific details are set forth in order to describe example embodiments of the invention, it should be apparent to one skilled in the art that the invention can be practiced without, or with variation of these specific details.

The IHS/IS may also be adapted to have an electrical function. Reference is made to U.S. patent application Ser. No. 09/964,586, Patent Publication No. 2003/0062602 A1, entitled "Arrangements to Supply Power to Semiconductor Package" by inventors Kristopher Frutschy, Chee-Yee Chung, and Bob Sankman filed on Sep. 28, 2001, and published on Apr. 3, 2003.

While the following detailed description will describe example embodiments of the IHS/IS arrangements applied to thin-core substrates and coreless substrates in the context of an example FC-PGA arrangement, practice of embodiments of the present invention is not limited to such context, i.e. practice of embodiments of the present invention may have uses with other types of chips and with other types of mounting and packaging technologies, e.g. flip chip ball grid array (FC-BGA) packages, interposers, etc. In addition, embodiments of the invention are applicable to a variety of packages including organic, ceramic, and flex packages. Further, the term "substrate" as used in describing example embodiments can include a variety of surfaces, or layers.

Turning now to detailed description, FIG. 1 relates to a perspective view of an example FC-PGA system useful in explanation and understanding of background and example embodiments of the present invention. More particularly, FIG. 1 illustrates an integrated circuit (IC) printed circuit board (PCB) carrier package system, and even more particularly, an example FC-PGA system 100 formed of a substrate 110 having a FC 120 mounted thereto, FC underfill 125, pins 130, die side components (DSCs) 140, a plurality of exposed electrical interconnections 150, and an indexing mark 160. The substrate 110 may be, for example, a fiber-reinforced (FR) resin substrate, the FC 120 may be a solder-bumped FC die, and the underfill 125 may be an epoxy underfill. The pins 130 may be arranged in a PGA, and may be formed of copper alloy or Kovar material, which is plated with nickel (Ni), and gold (Au). The DSCs 140 are optional, and may be, for example decoupling capacitors, or resistors. In some industry embodiments, DSCs may be prohibited from a die (primary) side of the substrate. The exposed electrical interconnections 150 may be, for example, exposed laminate vias and/or trace interconnections (described hereinafter). Finally, the indexing mark 160 may be a gold triangle, and serve as an index, for, for example a pin number 1.

Figure 2:
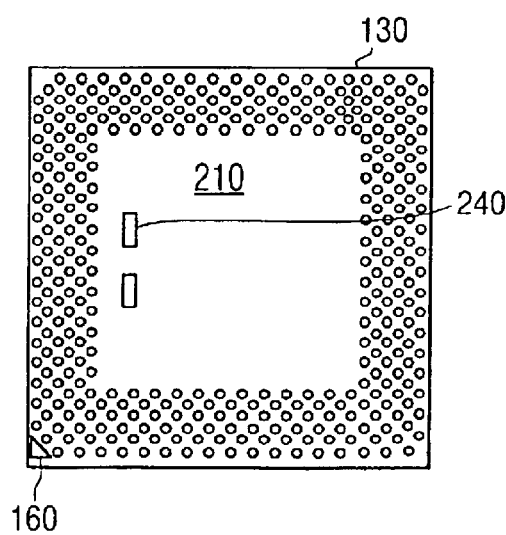
FIG. 2 is a bottom view of the example FIG. 1 FC-PGA substrate.

Turning next to FIG. 2, there is shown a bottom view of the example FIG. 1 FC-PGA substrate. More specifically, the bottom view 210 illustrates an example layout of a bottom (or pin) side PGA, and pin (secondary) side components (PSCs) 240 (e.g. decoupling capacitors, and resistors).

Figure 3:
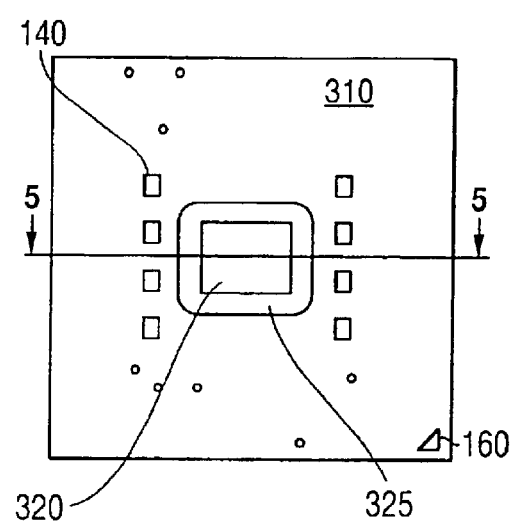
FIG. 3 is a top view of the example FIG. 1 FC-PGA substrate.

FIG. 3 is a top view of the example FIG. 1 FC-PGA substrate. More specifically, such top view 310 illustrates a die mounting area 320, a FC underfill area 325, and DSCs 140.

Figure 4:
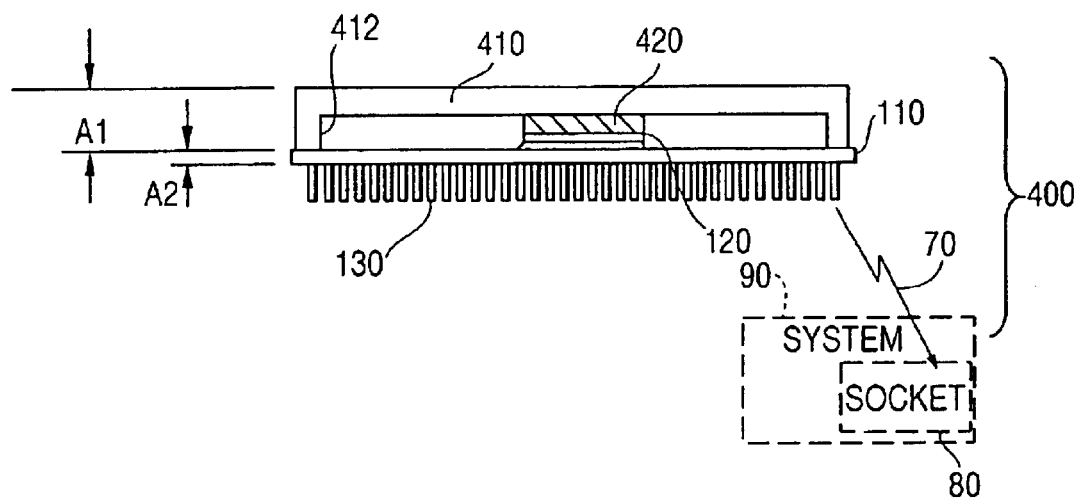
FIG. 4 is a simplistic cross-sectional side view of the example FIG. 1 FC-PGA substrate with a mounted integrated heat spreader (IHS) (without an integrated stiffener)

FIG. 4 is a simplistic cross-sectional side view of the example FIG. 1, FC-PGA 100, which may further include an IHS 410 (without integrated stiffener) mounted on top of FC die 120 through a thermal interface agent 420, such as thermal grease or conductive epoxy, and further may include a lip portion 412 which may be bonded to the edges of the substrate, e.g., using an adhesive or solder. The lip may be very thin as a main purpose of the lip 412 is the bonding thereof to the substrate and hermetic sealing of the package (as opposed to stiffening). That is, as the lipped EIS was applied to thick core substrates not having rigidity concerns, the lip was not designed to provide stiffening support to the substrate. Another purpose of the IHS was to provide a convenient mechanism for attachment of customized heat sink designs thereto. The simplistic side view 400 further includes dimensional notations of interest including A1, which represents a (die+IHS) height above substrate 110, and A2, which represents a substrate 110 thickness. The FC-PGA arrangement is in turn, insertable (indicated by arrow 70) into a socket 80 of an electronic system 90 (e.g., a notebook computer, cell phone, PDA, etc.).

Figure 5:
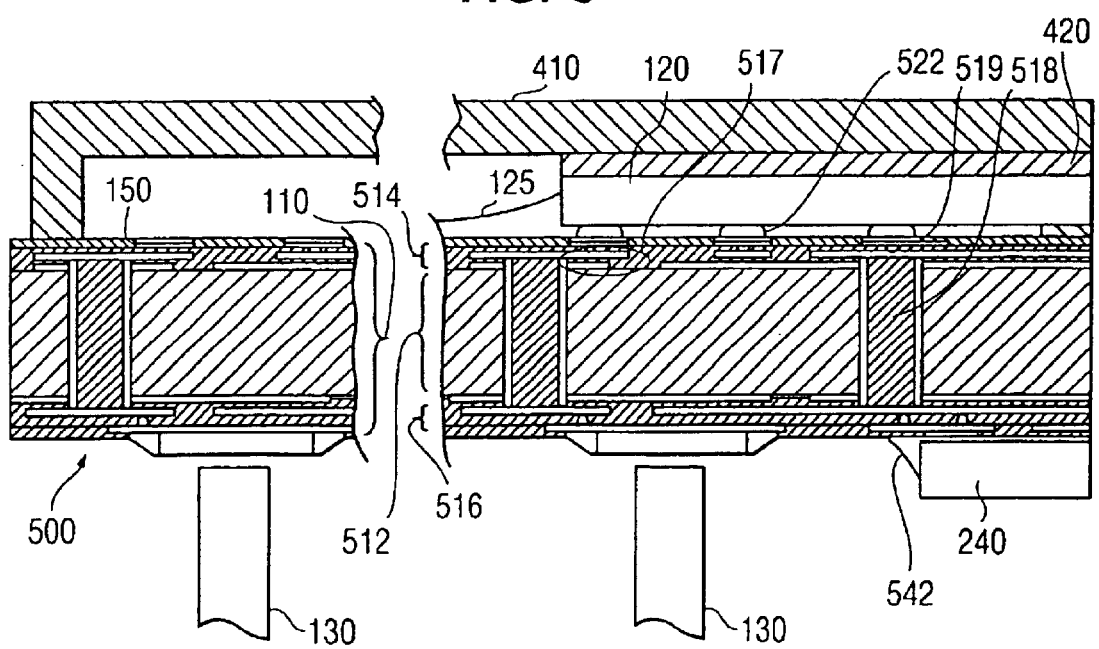
FIG. 5 is a magnified partial cross-sectional view of a part of the FIG. 1 FC-PGA system as taken along the FIG. 3 cross-sectional line 5—5, and which has an attached IHS (without an integrated stiffener), such view being useful in explanation and understanding of background, and example embodiments of the present invention.

Turning now to more detailed illustration, and discussion or relevant constructions of the FIG. 1 FC-PGA, FIG. 5 is a magnified partial cross-sectional view of a part of the FIG. 1 FC-PGA system as taken along the FIG. 3 cross-sectional line 5—5, and which has an attached IHS, such view being useful in explanation, and understanding, of background and example embodiments of the present invention. FIG. 5 shows an IHS 410 mounted on top of FC die 120 through a thermal interface material 420, such as thermal grease or conductive epoxy. The IHS may be made of any suitable thermally conductive material, for example, nickel-coated copper.

Particularly, the magnified partial cross-sectional view 500 more clearly illustrates that the FC-PGA substrate 110 is a pinned, laminated PCB structure in the form of an organic structure including an internal core 512 which may be, for example, a FR substrate formed of Bismaleimide Triazine (BT) resin reinforced with glass fiber, with a transition temperature (Tg) ranging from 165°–175° C. The core 512 may be 0.7–0.8 mm in thickness, and further, may be surrounded by multi-laminate layers on both sides of the core. More particularly, die (primary) side laminate layers 514 may be provided on a die side of the core 512, whereas pin (secondary) side laminate layers 516 maybe provided on a pin side of the core 512. The multi-laminate layers generally contain additional ground, power, and signaling interconnects 517, for example in the form of copper traces separated by dielectric layers, to provide electrical interconnections between the pins 130, and the substrate lands 519 (which, in turn, interface with, and electrically interconnect to the FC bumps 522 of the FC 120).

Further included as substrate interconnections structures are via holes 518 drilled at least partially through the core 512 and/or laminate layers 514, 516, and filled with electrically-conductive material to provide appropriate interlayer electric conduction paths. The FC 120 is more clearly shown as having a FC underfill 125 associated therewith for bonding, and hermetic sealing, while PSCs 240 are more clearly shown as having a PSC underfill 542 associated therewith for bonding, and hermetic sealing.

Whereas the internal core 512 may be, for example 0.7–0.8 mm in thickness, the laminate layers 514, 516 may be, for example, constructed of a plurality of 15 μm copper interconnect laminate layers, and for example 30 μm dielectric laminate layers. Overall, a thickness dimension (A2, FIG. 4) of the substrate 100 may be, for example in a thickness range of 1.0–1.2 mm. In contrast, the die 120 may be, for example, in a thickness range of 0.6–0.9 mm, and may be 0.8 mm.

The thick core 512 of FIG. 5 affords a high degree of rigidity, or stiffness, to the FC-PGA substrate 110 such that, when the FC 120 is mounted and interconnected to the substrate 100 via high pressure, and heat (i.e. a high temperature thermo-bonding process), the FIG. 5. FC-PGA experiences a negligible amount of deflection, bending and flexing. Accordingly, the FC 120 can be securely, and reliably mounted, and interconnected to the substrate 100, and further hermetically sealed/protected by the lipped IHS. The FIG. 5, thick core substrate FC-PGA, however, is thick and heavy. More specifically, as previously indicated, there is a significant drive from the mobile (e.g. notebooks, cell phones and PDAs) section of the electronics industry to achieve thinner, and more light-weight electronic arrangements. Accordingly, there is interest in developing thin-core, and coreless substrate arrangements. Examples of thin-core and coreless substrates will be discussed.

Figure 6:
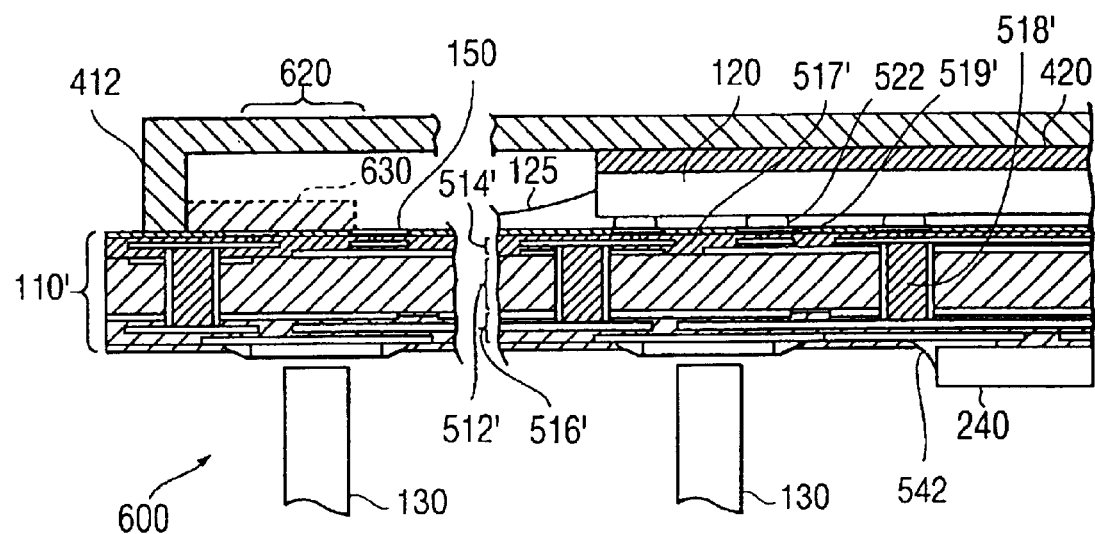
FIG. 6 is another magnified, partial cross-sectional view similar to FIG. 5, but which illustrates an alternative example of a FC-PGA arrangement which has a thin-core substrate, and which has an example integrated heat spreader with integrated stiffener (IHS/IS) arrangement as one example embodiment of the present invention.

More specifically, turning first to an illustration, and discussion of a thin-core substrate arrangement, FIG. 6 is another magnified, partial cross-sectional view similar to FIG. 5, but which illustrates an alternative example of a FC-PGA arrangement which has a thin-core substrate, and which has an example IHS/IS 620 as one example embodiment of the present invention.

Only differences between FIGS. 5 and 6 will be discussed for the sake of brevity. FIG. 6 illustrates an arrangement 600, including a substrate 110' composed of a thin-core 512' which may be in a thickness range of, for example, 0.1–0.5 mm, and more specifically, 0.4 mm, for example. The thin-core 512' may be constructed of FR substrate materials as previously discussed, or alternatively, may be differing materials affording an even higher degree of rigidity.

A remainder of the construction is substantially the same as FIG. 5, with FIG. 6 likewise including die side laminate layers 514', pin side laminate layers 516', laminate interconnections 517', vias 518', and substrate lands 519'. In comparing the background FIG. 5 arrangement having the thick core substrate of the example 0.8 mm core thickness, note that the FIG. 6 arrangement having the thin-core substrate of the example 0.4 mm core thickness results in a thickness savings of approximately 0.4 mm, as well as a corresponding weight and raw material savings. Discussion of the IHS 620 will be made ahead.

Figure 7:
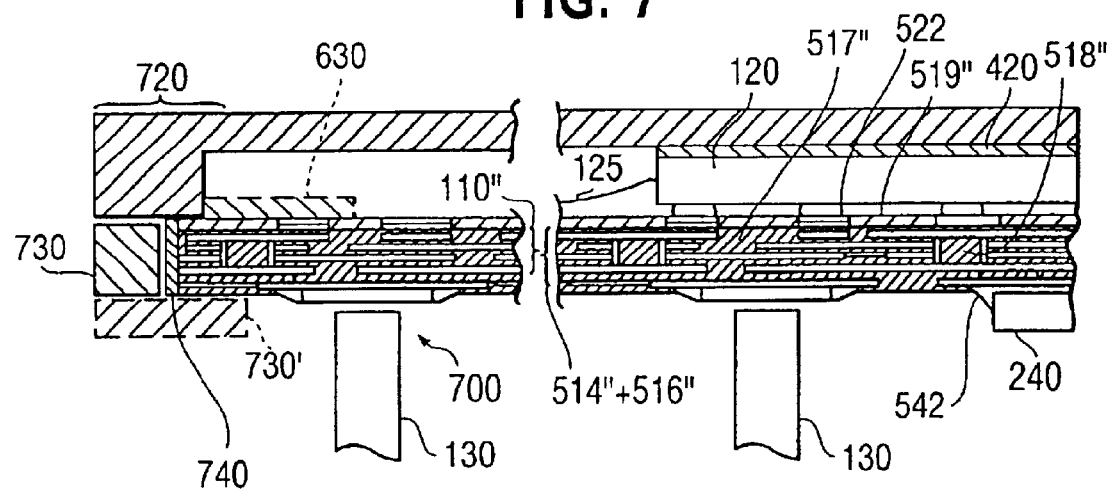
FIG. 7 is another magnified, partial cross-sectional view which shows an alternative example of a FC-PGA arrangement which has a coreless substrate, and which has an example IHS/IS arrangement as another example embodiment of the present invention.

Tuning next to description of a coreless substrate arrangement, FIG. 7 is another magnified, partial cross-sectional view, which shows another alternative example of a FC-PGA arrangement 700 which has a coreless substrate, and which has an IHS/IS arrangement 720 as another example embodiment of the present invention. More specifically the arrangement 700 includes a substrate 110" in which the core has been omitted, such that the substrate 110" corresponds only to a combination of the die side laminate layers 514", and pin side laminate layer 516". In comparing again with the FIG. 5 arrangement, note that the FIG. 7 coreless substrate arrangement results in an even greater thickness savings of approximately 0.8 mm, and again substantial weight savings.

Again the various laminate copper interconnect layers, and dielectric layers 514", 516", laminate interconnections 517", vias 518", and lands 519" may be as previously discussed, or alternatively may be of differing materials affording an even higher degree of rigidity. Just like the IHS 620, the IHS 720 will be discussed ahead.

As thin core and coreless substrate technologies are in their infancy, the thin-core and coreless substrate arrangements pose significant technical challenges with respect to mechanical strength during pinning, assembly, testing, and socket engagement, for example. More particularly, discussion now turns to special considerations with respect to the FIG. 6 thin-core substrate arrangement, and the FIG. 7 coreless substrate arrangement.

Figure 8:
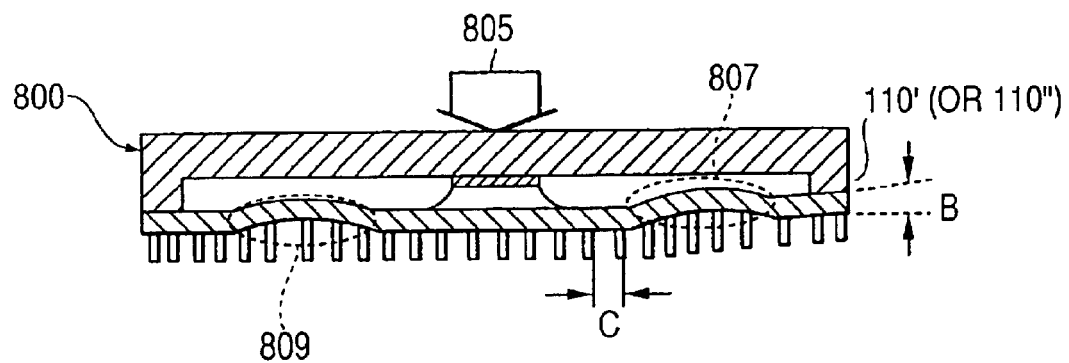
FIG. 8 is a simplified side view of the FIG. 6 example FC-PGA thin-core substrate arrangement, or the FIG. 7 FC-PGA example coreless substrate, with a mounted IHS (without integrated stiffener) with pressure applied thereto, resulting in deflection, bending, flexing, and distortion of the thin-core or coreless substrate.

To begin such discussion attention turns to FIG. 8, which is a simplified cross-sectional view of example FC-PGA with IHS (without integrated stiffener) arrangement of a thin-core or coreless type, with pressure applied thereto. More specifically FIG. 8 illustrates a side view 800 of a thin core substrate 110', or coreless substrate 110", having pressure 805 applied thereto, e.g. for the purpose of FC pressure/high temperature mounting, and interconnecting. There is an approximate proportional relationship of the stiffness of the substrate to the thickness of the substrate cubed, that is for example, as the thickness of the substrate is reduced by half, there is an eight-fold reduction in stiffness. Due to the reduced rigidity or stiffness, the result is a deflection (or bending B, flexing, or distortion) of all, or at least portions, of the thin-core or coreless substrate. As shown in exaggerated form in FIG. 8, the thin-core or coreless substrate 110', 110" experiences substantial deflection (or bending, flexing, distortion) upon pressure application. Substantial deflection occurs especially in the unsupported lipto-die region as shown representatively by the dashed lines 807,809. That is, the thin-core or coreless substrate 110', 110" does not have sufficient rigidity as does the FIG. 5 thicker core substrate 110 arrangement.

The deflection, bending, or flexing may result in unequal pressure distribution and stresses applied across the FC die 120 with resultant FC die cracking. The excessive deflection, bending, flexing, or distortion may prevent, or break critical electrical, bonding and interconnection between various ones of the bonded FC-bump 522/substrate-land 519', 519" pairs. Another distinct possibility is that excessive deflection, bending, flexing, or distortion may cause the laminate layers 514'/516', 514"/516" to experience laminate separation, which may in turn result in critical electrical interconnect disruption within the laminate layers, and even total de-lamination. A further distinct possibility of excessive deflection, bending, flexing, or distortion is that it may cause cracking or improper underfill seating of either, or both, of the FC underfill 125, or PSC underfill 542, leading to an imperfect bonding and/or imperfect hermetic seal (which may later lead to moisture issues, or gas contamination).

Still a further possibility is a major grid misalignment between (disturbance of) respective pins of the PGA, such being shown in exaggerated form as C within FIG. 8. Any PGA pin misalignment would have difficult realignment of a multitude (e.g. many tens) of pins to be accomplished by an end user so as to allow the FC-PGA arrangement to be mounted to an interfacing component (e.g. socket 80 (FIG. 4)). In addition, excessive deflection, bending, or flexing may result in partial, or total, DSC and/or PSC delamination, resulting in separation, and detachment, from the substrate 110', 110". Even after FC bonding, pressure exerted to the arrangement, e.g. during socket mounting or heat sink mounting, may likewise result in the excessive bending, flexing, distortion, and accompanying issues (e.g. metallic heat sink tilt resulting in contact of the exposed electrical interconnections).

Figure 9:
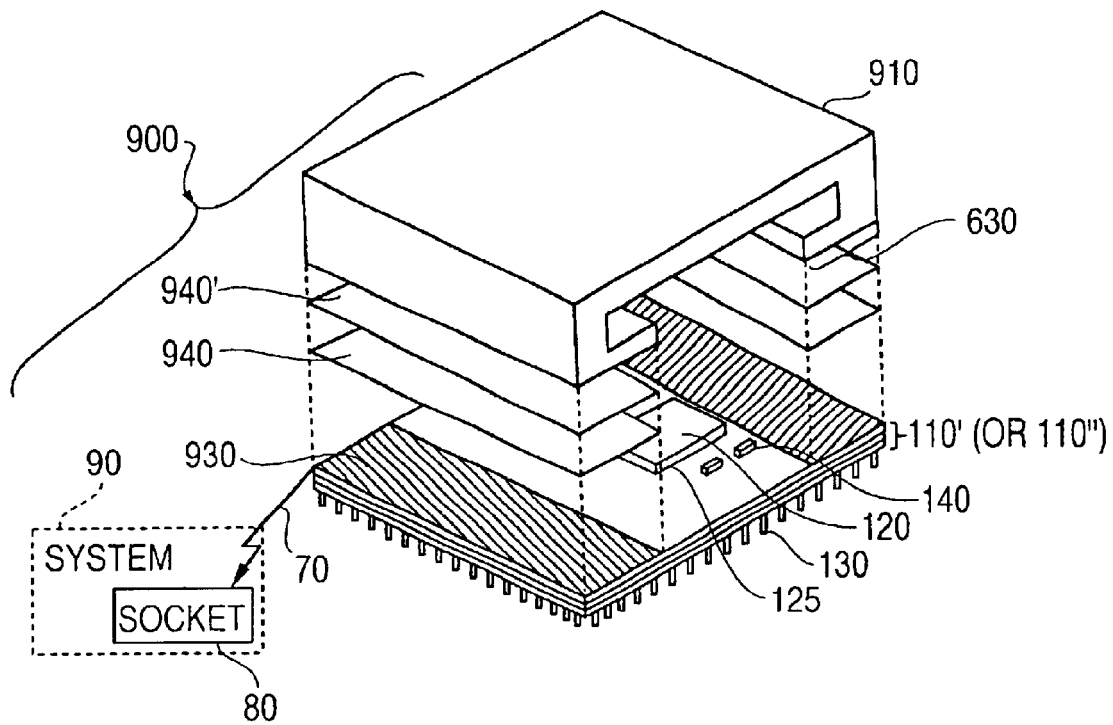
FIG. 9 is a perspective, partially-exploded view of an example FC-PGA system having an example IHS/IS arrangement according to one embodiment of the present invention.

Discussion turns now to example embodiments useful in preventing excessive deflection, bending, flexing, or distortion. More particularly, FIG. 9 is a perspective, partially-exploded view of an example, FC-PGA system having an example IHS/IS arrangement according to one embodiment of the present invention. More specifically, FIG. 9 illustrates a stiffened arrangement 900 in partial exploded view, and including an example IHS/IS 910 located on a major die side plane of the substrate. The stiffening provided by the IHS/IS 910 may be provided by an extended base, stiffener extension, or support shelf 630 extending (e.g., inwardly) from the lip of the substrate 110', 110" towards the center of the substrate 110', 110" essentially parallel to the top plane of the substrate 110', 110". The FIG. 6 embodiment shows (in representative dashed-line form) the IHS/IS with the lip, or shelf, or stiffener extension 630 (in representative dashed-line form) extending outwardly towards the center of the substrate. Alternatively, an IHS/IS smaller than the substrate may have extended base 920 also extending outwardly towards the edge of the substrate 110', 110". Such extended base, stiffener extension, or support shelf 630 may be one of a monolithic construction as the IHS, or manufactured separately, and integrated by a separate process (e.g., welding, molding) with the IHS.

The IHS/IS 910 will have a contact footprint 930 with the substrate 110', 110". The IHS/IS 910 may be attached in a variety of manners to the substrate 110', 110" including attachment by a thermally conductive adhesive layer(s) 940, or soldering (e.g., to facilitate conductivity). In addition, or alternatively, the bottom of the extended base of the IHS/IS may have a pinned or otherwise keyed arrangement to facilitate in proper alignment, attachment, or act as attachment points, and also facilitate conductivity. As an alternative to conductivity e.g., being electrically connected, the IHS/IS may also be electrically insulated from the substrate or exposed electrical interconnections, by an electrically insulating layer 940' (FIG. 9) which may be an electrically insulating adhesive layer, or a gasket.

The IHS/IS may be formed of any IHS thermally conductive material providing a desired degree of stiffness or rigidity to the thin-core/coreless substrate 110', 110". As to formation, the IHS/IS 910 may be formed though a well-known process, for example, a non-exhaustive listing of suitable processes includes molding, stamping, etching, depositing, and extruding. The IHS/IS may be, for example, made of metal, or even a plastic having suitable thermally conductive properties. The IHS/IS may be made of a suitable material capable of withstanding elevated temperatures, which may be experienced during a FC mounting/bonding operation, or during normal chip operations. The IHS/IS 910 may have adequate clearance such that it does not interfere with other FC-PGA components, such as the die, underfill, and DSCs.

Figure 10:
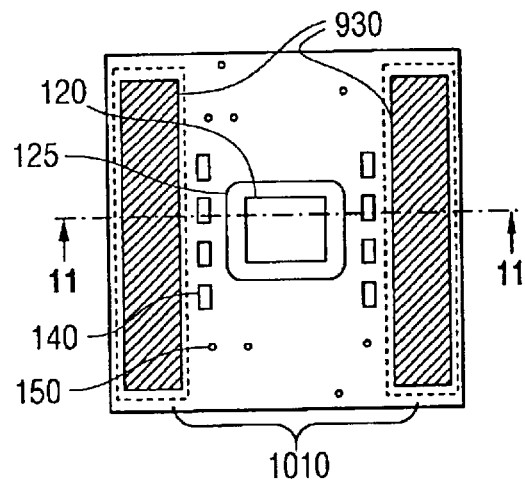
FIG. 10 is a top view of the example FIG. 9 FC-PGA system, and showing a top view of an example contact footprint of the IHS/IS, and an example keep-out zone, on the substrate.

Turning now to further relevant discussions FIG. 10 is a top view of the example FIG. 9 FC-PGA system, showing a contact footprint 930 of the example embodiment IHS/IS 910 on the die plane of the substrate. This view also illustrates there may be a keep-out zone 1010, with any exposed electrical interconnections, component, or other raised protrusions to be located outside such keep-out zone 1010. The keep-out zone 1010 may be a same size as contact footprint 930 or may be larger than the contact footprint 930 to allow for misalignment tolerances of the IHS/IS attachment.

Figure 11:
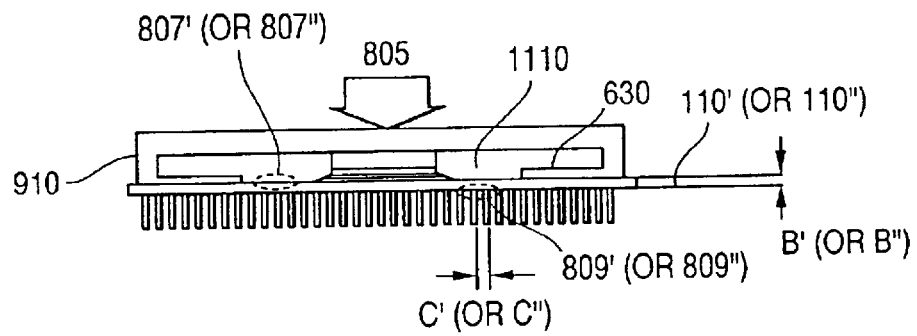
FIG. 11 is a simplified cross-sectional view as taken along cross-sectional lines 11—11 in FIG. 10, such view being useful in illustrating another view of the FIG. 9 IHS/IS, and illustrating the improved rigidity or stiffening support of a thin-core or coreless substrate having an example integrated stiffener portion of the present invention attached thereto.

FIG. 11 is a simplified cross-section view as taken along cross-sectional lines 11—11 in FIG. 10, such view being useful in illustrating a side view of the FIG. 9 IHS/IS, and illustrating the improved rigidity of a thin-core or coreless substrate having the example integrated stiffener portion of the present invention attached thereto. With regard to further detail, FIG. 11 illustrates the pressure 805 (such as a FC mounting/connecting pressure) being applied to a thin-core substrate 110' arrangement, or a coreless substrate 110", arrangement having the stiffener 910 thereon. As shown within FIG. 11, the IHS/IS 910 provides enhanced rigidity such that the substrate 110', 110" does not experience substantial deflection, bending, flexing, or distortion. Specifically 807' (or 807")/809' (or 809") will be a substantial percentage (e.g. 50, 60, 70, 80, 90% or even 100%) less than deflection 807/809 shown in FIG. 8. In addition bending B'(or B") and/or pin displacement C' (or C") will be substantially less than B/C shown in FIG. 8. With less deflection, bending, and less pin displacement, the previously discussed imperfect bonding, de-bonding, and de-lamination, and grid misalignment will also be consequentiality lessened. Thus, a thinner, lighter-weight device is achieved through use an IHS/IS 910. The greater the lip, shelf, stiffener extension 630 toward the die center, the greater the increase in substrate stiffness however, in one embodiment, the extension 630 may not extend complete to the die or underfill, but instead space may be left for DSCs, exposed traces, and die/IHS alignment tolerances.

In one example embodiment, the volume 1110 contained between the substrate 110'/110" and the IHS/IS 910 may be filled with air, or alternatively, filled with a thermally conductive material (e.g., fluid) to aid in heat dissipation.

Figure 12:
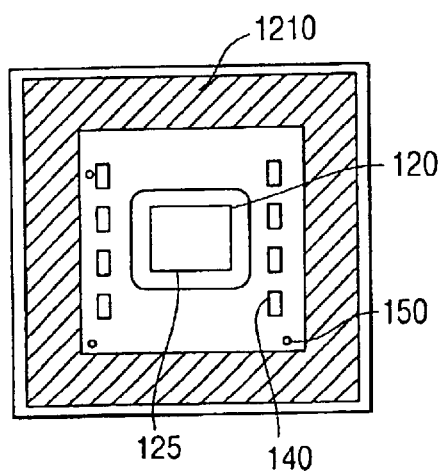
FIG. 12 is a top view similar to that of FIG. 10, but having an example rectangular window footprint according to another example of the present invention.

Discussions turn next to FIG. 12, which is a top view similar to that of FIG. 10, but having an example IHS/IS with an integrated stiffener contact footprint arrangement according to another example embodiment of the present invention. More particularly, FIG. 12 illustrates a rectangular, window footprint. One aspect to note with respect to comparison of FIG. 10 and FIG. 12, is that whereas the integrated stiffener 910 of FIG. 9 provides enhanced stiffness substantially along a single direction (e.g. unidirectionally), the integrated stiffener footprint 1210 of FIG. 12 indicates enhanced stiffness provided in a plurality of directions (e.g. bi-directionally). The example embodiment of FIG. 10 has the benefits of weight and material savings in situations where FC-PGA arrangements have unidirectional stiffening.

Figure 13:
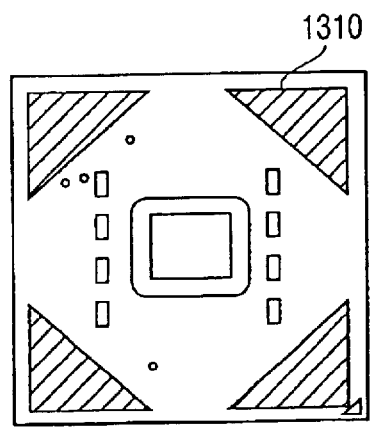
FIG. 13 likewise illustrates a top view having an example multiple contact footprint of the IHS/IS with the substrate.
Figure 14:
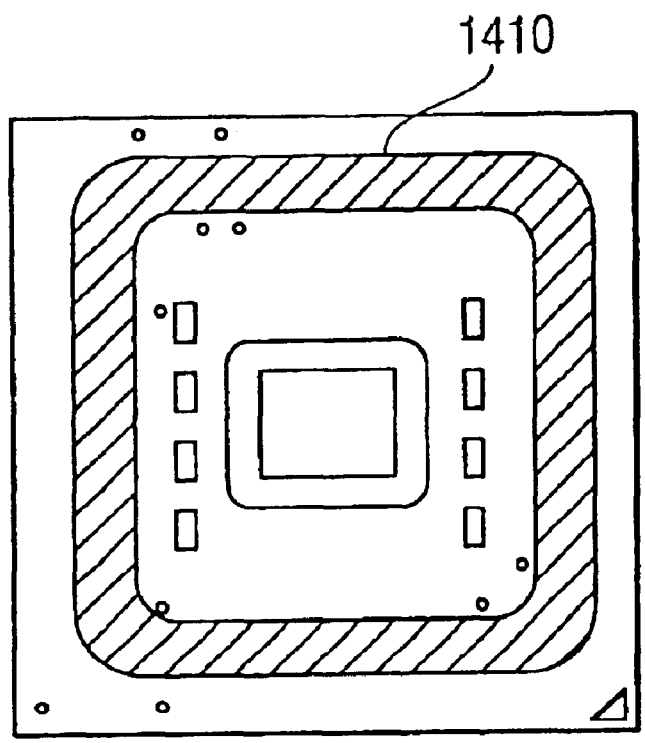
FIG. 14 also likewise illustrates a top view having an example alternatively shaped integrated stiffener portion and footprint according to another example embodiment of the present invention.

Continuing, FIG. 13 likewise illustrates a top view of the contact footprint of the IHS/IS with the die plane according to another example embodiment of the present invention. That is, FIG. 13 shows an example arrangement having integrated corner stiffening portions 1310 providing selective integrated stiffening with the IHS/IS. FIG. 14 also likewise illustrates a top view having an example alternatively shaped contact footprint 1410 of the IHS/IS according to another example embodiment of the present invention. FIG. 14 is illustrative of the fact that any regular, or non-regular geometric shape 1410 and even non-regular geometric shape is suitable for the contact footprint of the IHS/IS embodiments of the present invention. More specifically, practice of the integrated stiffeners of embodiments of the present invention may have only a minimum standard such that the integrated stiffener provide a sufficient level of stiffness in order to avoid excessive FC-PGA deflection, bending, flexing, or distortion. Some predetermined degree of deflection may be acceptable with respect to a given FC-PGA arrangement.

Figure 15:
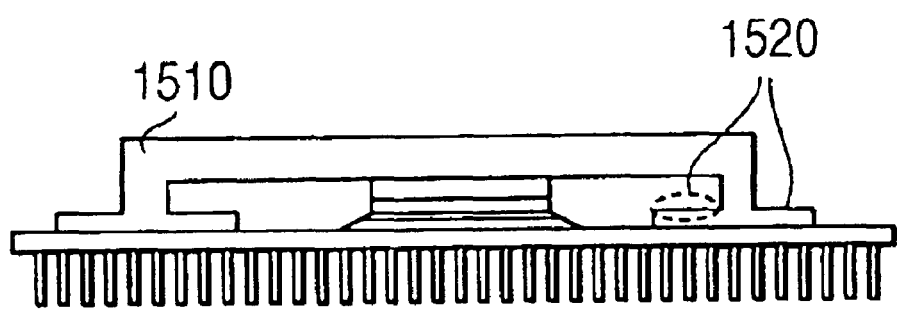
FIG. 15 illustrates a cross-sectional side view having an example alternatively sized IHS/IS with integrated stiffener portions extending horizontally beyond integrated heat spreader portion.

FIG. 15 shows a simplified side view of substrate with another example embodiment of the IHS/IS 1510 illustrating an IHS having a main body which is smaller in width (or area) than a width (or area) of the substrate, and which may have both outwardly, and inwardly, extended stiffening base portions in a plurality of directions 1520.

Figure 16:
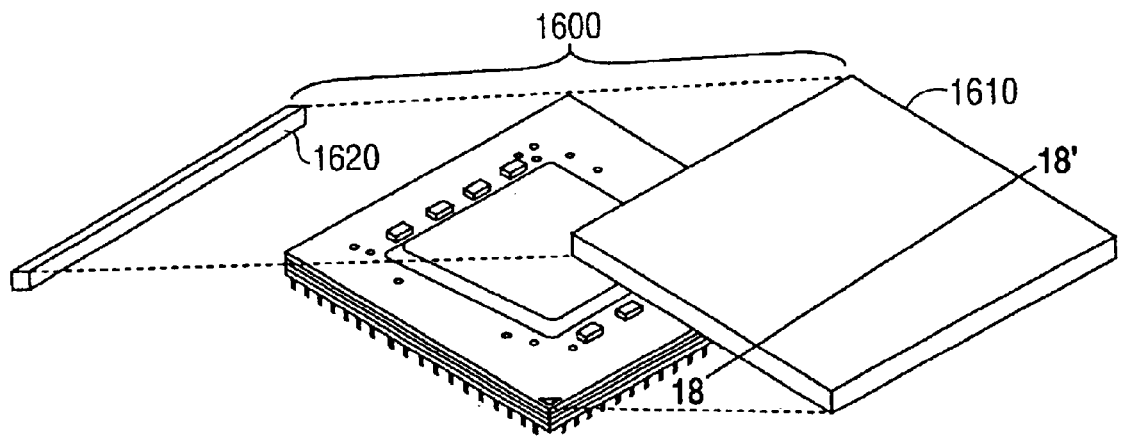
FIG. 16 is a perspective, partially exploded view of a FC-PGA system having an example IHS/IS arrangement with edge contact as another embodiment of the present invention being applied thereto.
Figure 17:
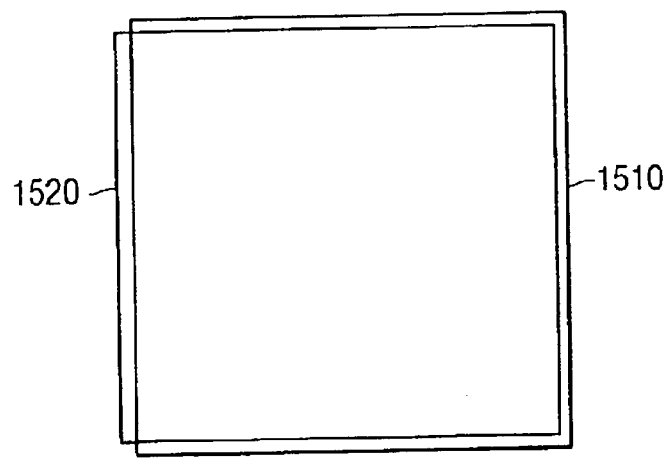
FIG. 17 is a top view of the FIG. 16 FC-PGA systems showing only the edge contact after the example IHS/IS has been applied.

FIG. 16 illustrates a perspective partially-exploded view of another example FC-PGA system having an example IHS/IS edge/ring arrangement as another example embodiment of the present invention being applied thereto. More specifically, illustrated as arrangement 1600 are IHS/IS edge components 1610, 1620 aligned for application to the FC-PGA, with FIG. 17 illustrating the top die-side plane-view of such IHS/IS edge, or ring, component already applied to the FC-PGA. That is, a first component 1610 may be a three-sided inverted box which, during installation, slides over or snaps onto three sides of the substrate 110', 110". The second component 1620 may slide over or snap onto the remaining side, so as to complete the hermetic sealing and stiffening support. With regard to construction, the integrated edge components of the IHS/IS may simply be flat, or may be of a generally C-shaped cross section which is adapted to mate with the edge of the substrate 110'/110" (see, e.g., the left hand side of FIG. 7). As illustrated by FIG. 7, another example stiffener embodiment may include a substrate perimeter ring stiffener 730, bonded to the substrate by e.g., epoxy 740. In one embodiment the ring stiffener 730 is of the same (or slightly less) thickness as (than) the substrate 110" so that it does not project above, or below, the substrate. This facilitates assembly machine (e.g.

paste-print and die attach) usage for both die attachment, and land side capacitor attachment. The stiffener ring 730 can be attached to the substrate 110" at high temperature so as the assembly cools the substrate is put into tension helping to keep it flat. One embodiment uses 4340 steel (e.g. Coefficient of thermal expansion (CTE)=12 ppm/° C.) for the stiffener ring because it will not shrink as much as the substrate (e.g. CTE=6 ppm/° C.). The epoxy's high CTE (e.g. 60 ppm/° C.) also aids substrate tension, because it will shrink more than both the stiffener ring and substrate. In this example embodiment, the IHS/IS 720 may be bonded (e.g., via adhesive (epoxy), soldering) mainly to the ring stiffener 730 (as opposed to the substrate 110', 110" perimeter). This way, pressure 805 is transferred to the rigid ring stiffener 730, rather than the less stiff periphery of the substrate. As one alternative, the IHS/IS 720 may also have inwardly or outwardly extending extensions as again shown representatively by the dashed line extension 630. As another alternative, the ring stiffener 730 may have inwardly extending extensions 730' which extend to overlap, or wrap around, below or above the substrate to further enhance stiffening.

In the IHS/IS edge, or ring, stiffener component arrangements of FIGS. 7, 16–17, a high level of stiffening maybe provided owing to the vertical sides, and C-shaped cross-section. Accordingly, such edge stiffener components may be able to be made of a thinner material. The edge stiffener components of FIGS. 7, 16–17 may be more difficult to manufacture, harder to mount to a FC-PGA, and the substrate 110', 110" thickness may have to be more tightly controlled so as to fit properly within the internal channel of the edge stiffening component 1520.

The interface agent 420 may be of varying thickness to compensate for height differences between the IHS/IS and the die height above the substrate. Prior discussion with regard to integrated stiffener mounted to the die plane is equally applicable to the example integrated edge/ring stiffener embodiment.

Figure 18:
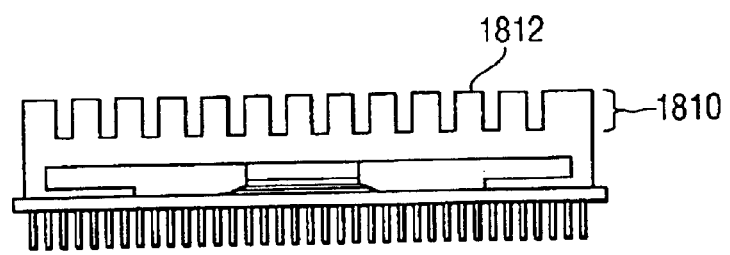
FIG. 18 is a simplified side view showing an example added cooling structure (e.g. fins) to provide an integrated heat spreader and integrated heat sink with integrated stiffener.

The integrated IHS/IS component may also be configured to serve as a heat sink. FIG. 18 illustrates a side-view of an embodiment of the present invention 1810 of an integrated heat spreader and integrated heat sink with integrated stiffeners having optional cooling fins 1812 to aid in heat dissipation.

As a further embodiment, the IHS/IS may be electrically connected to the substrate to help serve as a ground plane. The IHS/IS in this example embodiment is electrically connected through an electrically adhesive layer 940' (e.g. solder), and/or through bottom pins on the integrated stiffener extension 920, so as to act as a ground plane. This embodiment aids in control of static discharge.

In addition, the stiffened thin-core/coreless substrate FC-PGA arrangements of embodiments of the present invention may also reduce packaging parameters (e.g. inductance, resistance, etc.) owing to the thinner size, and reduced interconnection lengths.

In conclusion, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A package comprising:
   one of a thin-core and coreless substrate of an integrated circuit printed circuit board carrier package; and
   an Integrated Heat Spreader/Integrated Stiffener mounted to the substrate, the Integrated Heat Spreader/Inegrated Stiffener including a side wall portion to mount transverse to the substrate and a stiffener extension to extend from the side wall portion toward a center of the Integrated Heat Spreader/Integrated Stiffener.

2. The package as claimed in claim 1, the package being one of a pinned grid array, and a ball grid array carrier package.

3. The package as claimed in claim 1, the package being one of a flip chip pin grid array, and a flip chip ball grid array carrier package.

4. The package as claimed in claim 1, the Integrated Heat Spreader/Integrated Stiffener substantially made of a thermally conductive material in a form of one of a molded, stamped, etched, extruded and deposited Integrated Heat Spreader/Inegrated Stiffener, wherein the thermally conductive material withstands temperatures of at least normal integrated circuit operation.

5. The package as claimed in claim 1, wherein the stiffener extension is substantially planar and mounted to a substantially planar die-side surface of the substrate.

6. The package as claimed in claim 1, the Integrated Heat Spreader/Integrated Stiffener having an internal cavity therein to provide clearance for at least one of a die, underfill, and die side component.

7. The package as claimed in claim 1, the Integrated Heat Spreader/Integrated Stiffener having separate multiple attachment parts.

8. The package as claimed in claim 1, having a mountable above-substrate cavity-height which is one of equal to, and greater than, an above-substrate height, of a mounted integrated circuit die.

9. An Integrated Heat Spreader/Integrated Stiffener mountable to one of a thin-core and coreless substrate, the Integrated Heat Spreader/Integrated Stiffener including a side wall portion to mount transverse to the substrate and a stiffener extension to extend from the side wall portion toward a center of the Integrated Heat Spreader/Integrated Stiffener, the Integrated Heat Spreader/Integrated Stiffener having a mountable bottom surface of the stiffener extension which is substantially co-planar with and mounted to a top die-side surface of the substrate.

10. The package as claimed in claim 1, the Integrated Heat Spreader/Integrated Stiffener being mountable to support a heat sink.

11. The package as claimed in claim 1, the Integrated Heat Spreader/Integrated Stiffener having an integrated cooling structure.

12. The package as claimed in claim 1, the Integrated Heat Spreader/Integrated Stiffener being electrically connected to the substrate.

13. The package as claimed in claim 1, the Integrated Heat Spreader/Integrated Stiffener being electrically insulatable from the substrate.

14. An Integrated Heat Spreader/Integrated Stiffener as claimed in claim 9, the integrated stiffener portion being an edge/ring stiffener mountable to minor-planar side surfaces of the substrate.

15. An Integrated Heat Spreader/Integrated Stiffener as claimed in claim 9, the integrated stiffener portion being an edge/ring stiffener having a non-flat cross section mateable with side surfaces of the substrate.

16. A carrier package comprising:
one of a thin-core and coreless substrate of an integrated circuit printed xircuit board; and
an Integrated Heat Spreader/Integrated Stiffener mounted to said substrate, the Integrated Heat Spreader/Integrated Stiffener including a side wall portion to mount transverse to the substrate and a stiffener extension to extend from the side wall portion toward a center of the Integrated Heat Spreader/Integrated Stiffener, the stiffener extension comprising an integrated stiffener extension which is substantially planar and mounted to a substantially planar die-side surface of the substrate.

17. A carrier package as claimed in claim 16, the package being one of a pinned grid array, and a ball grid array carrier package.

18. A carrier package as claimed in claim 16, the package being one of a flip chip pin grid array, and a flip chip ball grid-array carrier package.

19. A carrier package as claimed in claim 16, the Integrated Heat Spreader/Integrated Stiffener substantially made of a thermally conductive material in a form of one of a molded, stamped, etched, extruded and deposited Integrated Heat Spreader/Integrated Stiffener, wherein the thermally conductive material withstands temperatures of at least normal integrated circuit operation.

20. A carrier package as claimed in claim 16, the Integrated Heat Spreader/Integrated Stiffener having an internal cavity therein to provide clearance for at least one of a die, underfill, and die side component (DSC).

21. A carrier package as claimed in claim 16, the Integrated Heat Spreader/Integrated Stiffener being attached as multiple parts.

22. A carrier package as claimed in claim 16, the Integrated Heat Spreader/Integrated Stiffener having an above-substrate cavity height which is one of equal to, and greater than, an above-substrate plane-height of an integrated circuit die.

23. A carrier package as claimed in claim 16, the Integrated Heat Spreader/Integrated Stiffener having a bottom surface which is substantially co-planar with a top surface of a combination of an integrated circuit die with interface material.

24. A carrier package as claimed in claim 16, the Integrated Heat Spreader/Integrated Stiffener having a support portion to support a heat sink.

25. A carrier package as claimed in claim 16, the Integrated Heat Spreader/Integrated Stiffener having an integrated cooling structure.

26. A carrier package as claimed in claim 16, the Integrated Heat Spreader/Integrated Stiffener being electrically connected to the substrate.

27. A carrier package as claimed in claim 16, the Integrated Heat Spreader/Integrated Stiffener being electrically insulated from the substrate.

28. A carrier package as claimed in claim 16, the Integrated Heat Spreader/Integrated Stiffener having an edge/ring stiffener mounted to minor-planar side surfaces of the substrate.

29. A carrier package as claimed in claim 16, the Integrated Heat Spreader/Integrated Stiffener having an edge/ring stiffener having a non-flat cross section, mated with side surfaces of the substrate.

30. A packaged integrated circuit comprising:
an integrated circuit printed circuit board carrier package including one of a thin-core and coreless substrate; and
an Integrated Heat Spreader/Integrated Stiffener including a side wall portion to mount transverse to the substrate and a stiffener extension to extend from the side wall portion toward a center of the Integrated Heat Spreader/Integrated Stiffener, the stiffener extension comprising an integrated stiffener extension which is substantially planar and mounted to a substantially planar die-side major planar surface of the substrate.

31. A packaged integrated circuit as claimed in claim 30, the carrier package being one of a pin grid array, and a ball grid array carrier package.

32. A packaged integrated circuit as claimed in claim 30, the carrier package being one of a flip chip pin grid array, and a flip chip ball grid array carrier package.

33. A packaged IC as claimed in claim 30, where the Integrated Heat Spreader/Integrated Stiffener is substantially made of a thermally conductive material in a form of one of a molded, stamped, etched, extruded and deposited Integrated Heat Spreader/Integrated Stiffener, wherein the thermally conductive material withstands temperatures of at least normal integrated circuit operation.

34. A packaged integrated circuit as claimed in claim 30, the Integrated Heat Spreader/Integrated Stiffener having an internal cavity therein to provide clearance for at least one of a die, underfill, die-side component.

35. A packaged IC as claimed in claim 30, the Integrated Heat Spreader/Integrated Stiffener having multiple attached parts.

36. A packaged IC as claimed in claim 30, the Integrated Heat Spreader/Integrated Stiffener having an above-substrate cavity-height which is one of equal to, and greater than, an above-substrate height of a mounted integrated circuit die.

37. A packaged integrated circuit as claimed in claim 30, the Integrated Heat Spreader/Integrated Stiffener having a bottom surface which is substantially co-planar with a top surface of a combination of an integrated circuit die with interface material.

38. A packaged integrated circuit as claimed in claim 30, the Integrated Heat Spreader/Integrated Stiffener having a support portion to support a heat sink.

39. A packaged integrated circuit as claimed in claim 30, the Integrated Heat Spreader/Integrated Stiffener having an integrated cooling structure.

40. A packaged integrated circuit as claimed in claim 30, the Integrated Heat Spreader/Integrated Stiffener being electrically connected to the substrate.

41. A packaged integrated circuit as claimed in claim 30, the Integrated Heat Spreader/Integrated Stiffener being electrically insulated from the substrate.

42. A packaged integrated circuit as claimed in claim 30, the Integrated Heat Spreader/Integrated Stiffener being an edge/ring stiffener mounted to minor-planar side surfaces of the substrate.

43. A packaged integrated circuit as claimed in claim 30, the Integrated Heat Spreader/Integrated Stiffener being an edge/ring stiffener having a non-flat cross section mated with side surfaces of the substrate.

44. A heat spreader/stiffener device comprising a thermally conductive member having a side wall portion and a stiffener portion mountable to one of a thin-core and coreless substrate, the stiffener portion to extend from the side wall portion toward a center of the heat spreader/stiffener device and having a stiffener extension bottom surface being substantially planar to facilitate mounting to a substantially planar die-side surface of the substrate, the heat spreader/stiffener device having a thermal path thermally connectable to the substrate.

45. A heat spreader/stiffener as claimed in claim 44, the heat spreader/stiffener having a hollow frame shape to allow clearance for other components on the substrate.

46. A heat spreader/stiffener as claimed in claim 44, the heat spreader/stiffener mountable to support a heat sink.

47. A heat spreader/stiffener as claimed in claims 44, the stiffener portion being an edge/ring stiffener extension mountable to minor planar side-surfaces of the substrate.

48. An integrated circuit carrier package comprising:
an integrated circuit;
at least one of a thin-core and coreless substrate; and
a heat spreader/stiffener device with a thermally conductive member having a side wall portion and a stiffener portion mounted to the substrate to increase the substrate stiffness, the stiffener portion to extend from the side wall portion toward a center of the heat spreader/stiffener device, the heat spreader/stiffener device having a thermal path thermally connected to the substrate, a stiffener extension bottom surface being substantially planar and mounted to a substantially planar die-side surface of the substrate.

49. An integrated circuit carrier package as claimed in claim 48, the carrier package being one of a pinned grid array carrier package and a ball grid array carrier package.

50. An integrated circuit carrier package as claimed in claim 48, the heat spreader/stiffener device having a hollow frame shape to allow clearance for other components on the substrate.

51. A carrier package as claimed in claim 48, the heat spreader/stiffener having a portion to support a heat sink.

52. Withdrawn) A carrier package as claimed in claim 48, the stiffener portion being an edge/ring stiffener extension mounted to minor planar side-surfaces of the substrate.

53. An electronic system comprising:
an integrated circuit carrier package including an integrated circuit;
at least one of a thin-core and coreless substrate; and
a heat spreader/stiffener device with a thermally conductive member having a side wall portion and stiffener portion mounted to the substrate so as to increase the substrate stiffness, the stiffener portion to extend from said side wall portion toward a center of the heat spreader/stiffener device and mounted to a substantially planar die-side surface of the substrate, the heat spreader/stiffener device having a thermal path thermally connected to the substrate.

54. An electronic system as claimed in claim 53, the integrated circuit carrier package being one of a pinned grid array carrier package and a ball grid array carrier package.

55. The package as claimed in claims 1, the stiffener extension extending from a lip of the substrate towards a center of the substrate.

56. A carrier package as claimed in claim 16, the stiffener extension extending from a lip of the substrate towards a center of the substrate.

57. An electronic system as claimed in claim 53, the stiffener extension extending from a lip of the substrate towards a center of the substrate.

58. The package as claimed in claim 1, wherein the die-side surface of the substrate is opposite a pin-side surface of the substrate.

59. The package as claimed in claim 1, wherein a combination of an integrated circuit die with interface material is mounted between the top die-side surface of the substrate and a main portion of the heat spreader/integrated stiffener.

60. The package as claimed in claim 1, wherein the integrated stiffener extension has a bottom surface that is substantially coplanar with and mounted to the die-side surface of the substrate.

61. A package comprising:
one of a thin-core and a coreless substrate; and
a heat spreader/stiffener device mounted to the one of the thin-core and the coreless substrate, the device comprising:
a main portion extending along the substrate;
a first side wall portion coupled with the main portion and extending between the main portion and the substrate; and
a first stiffener portion mountable to the substrate so as to increase a stiffness thereof, the first stiffener portion extending from the first side wall portion toward a center of the heat spreader/stiffener device, the first stiffener portion having a stiffener extension bottom surface being substantially planar to facilitate mounting to a substantially planar die-side surface of the substrate.

62. The package of claim 61 wherein the device includes:
a second side wall portion coupled with the main portion and extending between the main portion and the substrate, wherein the second side wall portion is on the opposite end of the main portion from the first side wall portion; and
a second stiffener portion mountable to the substrate to increase a stiffness thereof, the second stiffener portion extending from the second side wall portion toward the center of the heat spreader/stiffener device, the second stiffener portion having a stiffener extension bottom surface being substantially planar to facilitate mounting to the substantially planar die-side surface of the substrate.

63. The package of claim 62 wherein the device includes third and fourth side wall portions coupled with respective third, and fourth stiffener portions.

64. The package of claim 63 wherein the first, second, third, and fourth stiffener portions form a substantially rectangular window footprint.

65. The package of claim 63 wherein the first, second, third, and fourth stiffener portions form a rectangular window footprint with curved edges.

66. The package of claim 63 wherein the first, second, third, and fourth mer stiffening portions, each having a triangular footprint.

67. The package of claim 61 wherein the first stiffener portion extends toward the center of the device, and extends away from the center of the device.

* * * * *

UNITED STATES PATENT AND TRADEMARK OFFICE
CERTIFICATE OF CORRECTION

| | |
|---|---|
| PATENT NO. | : 7,045,890 B2 |
| APPLICATION NO. | : 09/964494 |
| DATED | : May 16, 2006 |
| INVENTOR(S) | : Xie et al. |

It is certified that error appears in the above-identified patent and that said Letters Patent is hereby corrected as shown below:

On Title Page, in field (56), under "U.S. Patent Documents", in column 2, line 1, delete "361/758" and insert --361/758 / 257/712 --, therefor.

On Title Page, in field (56), under "U.S. Patent Documents", in column 2, line 4, delete "361/704" and insert -- 361/704 / 361/705 --, therefor.

On Title Page, in field (56), under "U.S. Patent Documents" in column 2, line 14, delete "438/108" and insert -- 438/108 / 438/121 --, therefor.

On Title Page, in field (56), under "U.S. Patent Documents" in column 2, line 20, delete "Dibene et al." and insert -- Dibene, II, et al. --, therefor.

On Title Page, in field (56), under "U.S. Patent Documents", in column 2, line 21, delete "Dibene et al." and insert -- Dibene, II, et al. --, therefor.

On Title page, in field (56), under "U.S. Patent Documents" in column 2, line 22, delete "6,599,779 B1" and insert -- 6,599,779 B2 --, therefor.

On Title Page, in field (56), under "Other Publications", in column 2, line 2, after "(1992)" insert -- , --.

UNITED STATES PATENT AND TRADEMARK OFFICE
CERTIFICATE OF CORRECTION

PATENT NO.         : 7,045,890 B2
APPLICATION NO.    : 09/964494
DATED              : May 16, 2006
INVENTOR(S)        : Xie et al.

It is certified that error appears in the above-identified patent and that said Letters Patent is hereby corrected as shown below:

In column 10, line 28, in Claim 1, delete "Inegrated" and insert -- Integrated --, therefor.

In column 10, line 43, in Claim 4, delete "Inegrated" and insert -- Integrated --, therefor.

In column 11, line 24, in Claim 16, delete "xircut" and insert -- circuit --, therefor.

In column 11, line 24, in Claim 16, delete "board;" and insert -- board (IC-PCB); --, therefor.

In column 11, line 40, in Claim, 18, delete "grid-array" and insert --grid array --, therefor.

In column 11, line 51, in Claim 20, after "component" delete "(DSC)".

In column 12, line 35, in Claim 33, delete "IC" and insert -- integrated circuit --, therefor.

In column 12, line 46, in Claim 35, delete "IC" and insert -- integrated circuit --, therefor.

In column 12, line 49, in Claim 36, delete "IC" and insert -- integrated circuit --, therefor.

In column 13, line 25, in Claim 47, delete "claims 44, " and insert -- claim 44, --, therefor.

UNITED STATES PATENT AND TRADEMARK OFFICE
CERTIFICATE OF CORRECTION

PATENT NO. : 7,045,890 B2
APPLICATION NO. : 09/964494
DATED : May 16, 2006
INVENTOR(S) : Xie et al.

It is certified that error appears in the above-identified patent and that said Letters Patent is hereby corrected as shown below:

In column 13, line 49, in Claim 52, before "A carrier" delete "Withdrawn)".

In column 14, line 1, in Claim 55, delete "claims 1," and insert -- claim 1, --, therefor.

In column 14, line 18, in Claim 60, delete "coplanar" and insert -- co-planar --, therefor.

In column 14, line 61, in Claim 66, delete "mer" and insert -- stiffner portions form four corner --, therefor.

Signed and Sealed this

Twenty-sixth Day of September, 2006

JON W. DUDAS
*Director of the United States Patent and Trademark Office*